United States Patent
Onishi et al.

(10) Patent No.: US 10,781,342 B2
(45) Date of Patent: Sep. 22, 2020

(54) POLISHING COMPOSITION

(71) Applicant: FUJIMI INCORPORATED, Kiyosu-shi (JP)

(72) Inventors: Shogo Onishi, Kiyosu (JP); Takeki Sato, Kiyosu (JP); Yukinobu Yoshizaki, Kiyosu (JP); Koichi Sakabe, Kiyosu (JP)

(73) Assignee: FUJIMI INCORPORATED (JP)

( * ) Notice: Subject to any disclaimer, the term of this patent is extended or adjusted under 35 U.S.C. 154(b) by 201 days.

(21) Appl. No.: 15/562,692

(22) PCT Filed: Mar. 11, 2016

(86) PCT No.: PCT/JP2016/057837
§ 371 (c)(1),
(2) Date: Sep. 28, 2017

(87) PCT Pub. No.: WO2016/158324
PCT Pub. Date: Oct. 6, 2016

(65) Prior Publication Data
US 2018/0057711 A1    Mar. 1, 2018

(30) Foreign Application Priority Data

Mar. 30, 2015 (JP) ................... 2015-069958
Sep. 30, 2015 (JP) ................... 2015-192753
Sep. 30, 2015 (JP) ................... 2015-192763

(51) Int. Cl.
B24B 37/04    (2012.01)
C09G 1/02    (2006.01)
C09K 3/14    (2006.01)
H01L 21/3105    (2006.01)

(52) U.S. Cl.
CPC .............. *C09G 1/02* (2013.01); *B24B 37/044* (2013.01); *C09K 3/1463* (2013.01); *H01L 21/31053* (2013.01)

(58) Field of Classification Search
CPC ...................................... B24B 1/00
USPC ............... 451/41, 37, 287–290; 252/79.1
See application file for complete search history.

(56) References Cited

U.S. PATENT DOCUMENTS

| | | | | |
|---|---|---|---|---|
| 2003/0168628 A1* | 9/2003 | Vacassy | ............ | C09G 1/02 252/79.1 |
| 2009/0081871 A1* | 3/2009 | Dysard | ............ | C09G 1/02 438/693 |
| 2010/0009538 A1 | 1/2010 | Kamimura | | |
| 2011/0081780 A1 | 4/2011 | Shida et al. | | |
| 2011/0183581 A1 | 7/2011 | Otsu et al. | | |
| 2011/0244684 A1 | 10/2011 | Kamimura | | |
| 2013/0146804 A1 | 6/2013 | Mizuno et al. | | |
| 2013/0244433 A1 | 9/2013 | Reiss et al. | | |
| 2015/0376458 A1* | 12/2015 | Grumbine | ............ | C09K 3/1436 216/53 |

FOREIGN PATENT DOCUMENTS

| | | |
|---|---|---|
| CN | 103180101 A | 6/2013 |
| JP | 2010-041029 A | 2/2010 |
| JP | 2010-041037 A1 | 2/2010 |
| JP | 2011-216581 A | 10/2011 |
| JP | 2012-040671 A | 3/2012 |
| JP | 2015-516476 A | 6/2015 |
| TW | 201217504 A1 | 8/2011 |
| TW | 201137065 A1 | 11/2011 |
| WO | 2009/154164 A1 | 12/2009 |

OTHER PUBLICATIONS

International Preliminary Report on Patentability for International Application No. PCT/JP2016/057837 dated Oct. 12, 2017.
International Search Report for International Application No. PCT/JP/2016/057837 dated Jul. 5, 2016.
JP Patent Application 2017-509495 Official Notice of Reason for Refusal, Translation of JP Official Notice of Reason for Refusal.
TW Office Action patent application No. 105108842, dated Sep. 27, 2019.
JP Office Action for JP Patent Application No. 2017-509495, dated Sep. 10, 2019.
First Office Action for CN Application No. 201680020274.4 dated Jan. 22, 2020.
CN103180101 A, US2013146804 A1.
Office Action in reference to TW 10920302050, dated Apr. 6, 2020.
Notice of Reason for Refusal in reference to JP 2017-509495, dated Apr. 6, 2020.
Office Action for CN Patent Application No. 201680020274.4, dated Jun. 22, 2020.

* cited by examiner

*Primary Examiner* — George B Nguyen
(74) *Attorney, Agent, or Firm* — Katten Munchin Rosenman LLP

(57) ABSTRACT

An object of the present invention is to provide a polishing composition which can sufficiently improve a polishing speed of an object to be polished having a silicon-oxygen bond such as a silicon oxide film or a polishing speed of an object to be polished having a silicon-nitrogen bond such as a silicon nitride film.
Providing a polishing composition including: (1) an organic compound which has an action site interacting with an object to be polished having a silicon-oxygen bond or a silicon-nitrogen bond and an acceleration site accelerating an access of a component polishing an object to be polished to the object to be polished; (2) abrasive grains; and (3) a dispersing medium.

12 Claims, No Drawings

POLISHING COMPOSITION

TECHNICAL FIELD

The present invention relates to a polishing composition.

BACKGROUND ART

In recent years, new fine processing techniques have been developed along with high integration and high performance of large scale integration (LSI). A chemical mechanical polishing (CMP) method is one of the techniques, and is a technique frequently used for planarization of an interlayer dielectrics, metal plug formation, and buried wiring (damascene wiring) formation in an LSI production process, in particular, in a multilayer wiring forming process.

The CMP has been applied to each process in manufacturing of a semiconductor, and as an aspect thereof, for example, application to a gate forming process in production of a transistor is mentioned. At the time of producing a transistor, a material such as a metal, silicon, silicon oxide, polycrystal silicon (polysilicon), or silicon nitride is polished in some cases, and thus there is a demand for controlling the polishing rate of each material depending on the structure of the transistor.

As a part of problems, there is also a demand for polishing an object to be polished containing a silicon oxide film at high speed.

As a technique related thereto, there is a technique that is not a technique for polishing only an object to be polished containing a silicon oxide film at high speed, but for example, provides an aqueous dispersion for chemical mechanical polishing which is intended to realize a high polishing speed to a copper layer, a barrier metal layer, and an interlayer dielectrics (cap layer) such as a TEOS layer (Patent Document 1).

In addition, as apart of problems, there is also a demand for polishing an object to be polished containing a silicon nitride film at high speed.

In order to cope with such a demand, for the purpose of providing a polishing composition which can polish a silicon nitride film at higher speed and a polishing method using the same, there is disclosed a polishing composition which is used for polishing silicon nitride, contains colloidal silica to which organic acid is immobilized, and has a pH of 6 or below (Patent Document 2).

CITATION LIST

Patent Documents

Patent Document 1: JP 2010-41029 A
Patent Document 2: JP 2012-40671 A

SUMMARY OF INVENTION

Technical Problem

However, in the technique of Patent Document 1, the object to be polished containing a silicon oxide film cannot be polished at high speed in some cases. In addition, Patent Document 2 describes that the object to be polished containing silicon nitride can be polished at high speed as compared to the polishing composition of the related art. However, there is also a demand of a user who wants to perform polishing at higher speed depending on circumstances, and from the viewpoint of coping with this demand, there is a scope for improvement in Patent Document 2.

In this regard, an object of the present invention is to provide a polishing composition which can sufficiently improve a polishing speed of an object to be polished having a silicon-oxygen bond such as a silicon oxide film or a polishing speed of an object to be polished having a silicon-nitrogen bond such as a silicon nitride film.

Solution to Problem

The inventors have conducted intensive studies in order to solve the above-described problem. As a result, it was found that the above-described problem is solved by a polishing composition including:

(1) an organic compound which has an action site interacting with an object to be polished having a silicon-oxygen bond or a silicon-nitrogen bond and an acceleration site accelerating an access of a component polishing an object to be polished to the object to be polished;
(2) abrasive grains; and
(3) a dispersing medium.

Effect of the Invention

According to the present invention, it is possible to provide a polishing composition which can sufficiently improve a polishing speed of an object to be polished having a silicon-oxygen bond such as a silicon oxide film or a polishing speed of an object to be polished having a silicon-nitrogen bond such as a silicon nitride film.

DESCRIPTION OF EMBODIMENTS

Hereinafter, the present invention will be described. Incidentally, the present invention is not limited only to the following embodiment. In addition, in the present specification, the expression "X to Y" indicating a range means "X or more but Y or less." Further, unless otherwise specified, the operations and the measurement of physical properties or the like are carried out under the conditions of room temperature (20 to 25° C.)/relative humidity of 40 to 50% RH.

<Polishing Composition>

The present invention is a polishing composition, which contains (1) an organic compound which has an action site interacting with an object to be polished having a silicon-oxygen bond or a silicon-nitrogen bond and an acceleration site accelerating an access of a component polishing an object to be polished to the object to be polished;
(2) abrasive grains; and
(3) a dispersing medium. In the present specification, this "polishing composition" is also referred to as the "polishing composition of the present invention."

With such a configuration, according to the present invention, it is possible to provide a polishing composition which can sufficiently improve a polishing speed of an object to be polished having a silicon-oxygen bond such as a silicon oxide film or a polishing speed of an object to be polished having a silicon-nitrogen bond such as a silicon nitride film.

(1) [Organic Compound]

As described above, the organic compound of the present invention has an action site interacting with an object to be polished having a silicon-oxygen bond or a silicon-nitrogen bond (hereinafter, simply referred to as "an object to be polished" in some cases) and an acceleration site accelerating an access of a component polishing the object to be polished.

The organic compound of the present invention has, in one molecule, both an action site interacting with an object to be polished and an acceleration site accelerating an access of the component polishing an object to be polished to the object to be polished. For this reason, the action site in the organic compound interacts with the object to be polished, and at the other side, the acceleration site accelerates an access of the component polishing the object to be polished to the object to be polished. For this reason, the polishing composition containing such an organic compound improves the polishing speed of the object to be polished. It is noted that a compound, which does not have both the action site and the acceleration site in one molecule, is distinguished from the organic compound of the present invention.

Further, in the specification, the expressions "the polishing speed of the object to be polished having a silicon-oxygen bond is improved" and "the polishing speed of the object to be polished having a silicon-nitrogen bond is improved" mean that, as compared to a case where an additive (that is, a component other than "the abrasive grains, the dispersing medium, and if necessary, the pH adjusting agent") is not added at all as presented in the section of Examples, the polishing speed of the object to be polished is improved in any of pH regions. In other words, the above expressions mean that when the polishing speed becomes slower as compared to a case where an additive (that is, a component other than "the abrasive grains, the dispersing medium, and if necessary, the pH adjusting agent") is not added at all, the organic compound does not have at least one of the action site and the acceleration site of the present invention. Further, in the present specification, the term "a component polishing an object to be polished" is a component which may polish an object to be polished, and means abrasive grains, for example.

(Action Site)

As described above, the organic compound of the present invention has the action site interacting with the object to be polished. Herein, the "action site" may have any structure as long as it is a site interacting with the object to be polished. Incidentally, the number of the action sites is not particularly limited as long as it is one or more in one molecule, and the number thereof may be 2 or more or 3 or more. In addition, for example, in the case of using one having an oligomer structure or a polymer structure as the organic compound, the number of the action sites is further increased, for example, according to the number of repeating units. The upper limit thereof is, for example, 10 or less, 8 or less, or 6 or less in the case of a monomer structure.

The action site preferably has a phosphonate group or a salt group thereof. The reason for this is as follows.

That is, as the object to be polished having a silicon-oxygen bond, particularly, a silicon oxide film or the like is assumed, and the silicon oxide film has a silanol group (Si—OH). Since the phosphonate group or the salt group thereof is a functional group that is chemically bonded to the silanol group (Si—OH), the action site may reliably interact with the object to be polished having a silicon-oxygen bond by the reaction property of adsorption.

Further, as the object to be polished having a silicon-nitrogen bond, a silicon nitride film or the like is assumed, and the phosphonate group or the salt group thereof easily acts on the silicon-nitrogen bond to increase the action frequency. In addition, the surface of the object to be polished having a silicon-nitrogen bond is positively charged, the phosphonic acid or the salt group thereof is disassociated to be negatively charged, the electrostatic attraction force acts therebetween, and thus the action site may reliably interact with the object to be polished having a silicon-nitrogen bond.

However, such mechanism is merely presumption, and needless to say, this mechanism does not limit the technical scope of the present invention. Incidentally, the number of phosphonate groups or salt groups thereof in the organic compound of the present invention is also not limited, but may be two or more.

In particular, when the object to be polished having a silicon-nitrogen bond is polished, according to the preferred embodiment of the present invention, the organic compound has two or more phosphonate groups or salt groups thereof.

The upper limit of the number of the phosphonate groups or salt groups thereof in the organic compound of the present invention is preferably 5 or less.

Incidentally, in the present specification, the salt of the term "or a salt thereof" is also not particularly limited, but a sodium salt, a potassium salt, and an ammonium salt are preferable.

(Acceleration Site)

Further, as described above, the organic compound of the present invention has the acceleration site for accelerating an access of a component polishing an object to be polished to the object to be polished.

Herein, the "acceleration site" may have any structure as long as it has an action of accelerating an access of the component polishing an object to be polished (for example, abrasive grains) to the object to be polished. Incidentally, the number of the acceleration sites is not particularly limited as long as it is one or more in one molecule, and the number thereof may be 2 or more or 3 or more. In addition, for example, in the case of using one having an oligomer structure or a polymer structure as the organic compound, the number of the acceleration sites is further increased, for example, according to the number of repeating units. The upper limit thereof is, for example, 10 or less, 8 or less, or 6 or less in the case of a monomer structure.

According to the preferred embodiment of the present invention, the acceleration site has a functional group having hydrophilicity. When the acceleration site has the functional group having hydrophilicity, wettability of the object to be polished such as silicon oxide or silicon nitride is improved.

Incidentally, in the specification, the expression "having hydrophilicity" means that the surface energy is 19.0 mN/m or more.

Description will be made in more detail. For example, when a phenyl group (benzene residue) is mentioned as an example, benzene that is a precursor of the phenyl group is added at a concentration of 10 mM into ultrapure water, and a TEOS layer (a wafer in which silicon oxide is formed on a silicon substrate) is immersed for 1 hour in a 25° C. atmosphere and then subjected to rinse cleaning with ultrapure water and dry treatment with dry air, thereby preparing a test substrate. The contact angle measurement is performed on this test substrate by using aqueous solutions each having a different surface tension (mixed solution for a wet tension test manufactured by Wako Pure Chemical Industries, Ltd.: 22.6 mN/m, 31.0 mN/m, 40.0 mN/m, 52.0 mN/m, and 64.0 mN/m). The contact angle measurement is performed by adding 5 μL of liquid droplet dropwise onto the substrate and then measuring the contact angle after 5 sec using a contact angle meter. The surface tension is calculated by using Zisman's Plot.

Similarly to that idea, the surface energy of the carboxyl group (acetic acid residue) can be calculated by changing the benzene to acetic acid, and the surface energy of the phosphonate group (phosphonic acid residue) can be calculated by changing the benzene to phosphonic acid.

As a result, since the surface energy of the phenyl group is 29.6 mN/m, it is possible to define that the phenyl group has hydrophilicity, and since the surface energy of the phosphonate group is 41.2 mN/m, it is possible to define that the phosphonate group has hydrophilicity.

Regarding the surface energy calculated in the similar manner, the surface energy of the amino group (ammonia residue) is 19.2 mN/m, the surface energy of the hydroxyl group is 67.5 mN/m, the surface energy of the carboxyl group (acetic acid residue) is 27.7 mN/m, the surface energy of the phosphate group (phosphoric acid residue) is 26.2 mN/m, and the surface energy of the group represented by the following Formula (1) (n=3) (oligooxyethylene group) (polyethylene oxide residue) is 48.2 mN/m. It is also possible to define that these groups have hydrophilicity.

In this way, it is possible to determine whether the "functional group" in the "acceleration site" has hydrophilicity.

Therefore, according to the preferred embodiment of the present invention, the functional group having hydrophilicity is at least one selected from the group consisting of an amino group, a hydroxyl group, a phosphonate group or a salt group thereof, a carboxyl group or a salt group thereof, a phosphate group or a salt group thereof, a sulfate group or a salt group thereof, a phenyl group (phenolic group), and a group represented by the following Formula (1) or a salt group thereof:

[Chemical Formula 1]

—(O-E)$_n$-H        (1)

wherein in Formula (1), E is an alkylene group having 1 to 3 carbon atoms and n is an integer of 1 to 15.

Herein, from the viewpoint of dispersing stability of the abrasive grains, n is preferably 3 to 14 and more preferably 5 to 10. In addition, specific examples of E include a methylene group, an ethylene group, and a propylene group.

Incidentally, when the object to be polished has a silicon-oxygen bond, the action site of the organic compound of the present invention is a phosphonate group or a salt group thereof, the acceleration site thereof has a hydrophilic functional group such as a phenyl group, an amino group, a hydroxyl group, or a carboxyl group, and silica is used as the abrasive grains, the phosphonate group or the salt group thereof interacts with Si—OH on the surface of the silicon oxide film and wettability of the silicon oxide film is improved by the action of the hydrophilic functional group. For this reason, the abrasive grains (silica) easily act on the surface of the silicon oxide film, and the number of the abrasive grains acting is increased. According to this, it is considered that the polishing speed is accelerated.

In addition, when the object to be polished has a silicon-oxygen bond, the action site of the organic compound of the present invention is a phosphonate group or a salt group thereof, the acceleration site thereof is also a phosphonate group or a salt group thereof, and silica is used as the abrasive grains, it is considered that wettability is improved and the abrasive grains (silica) have the following action effect other than the action effect that the abrasive grains easily act on the surface of the silicon oxide film as described above.

That is, since one of the phosphonate groups or salt groups thereof is chemically bonded to Si—OH on the surface of the abrasive grains and the other of the phosphonate groups or salt groups thereof interacts with Si—OH on the surface of the silicon oxide film in a self-assembling manner, the abrasive grains (silica) move on the surface of the silicon oxide film as if they are self-arranged. For this reason, it is considered that the polishing speed of the object to be polished is accelerated.

In addition, when the object to be polished has a silicon-nitrogen bond, the action site of the organic compound of the present invention is a phosphonate group or a salt group thereof, the acceleration site thereof has a hydrophilic functional group such as a phenyl group, an amino group, a hydroxyl group, or a carboxyl group, and sulfonic acid-immobilized silica is used as the abrasive grains, the phosphonate group or the salt group thereof interacts with the surface of the silicon nitride film, and at the other side, wettability of the silicon nitride film is improved by the action of the hydrophilic functional group. For this reason, the abrasive grains easily act on the surface of the silicon nitride film and the number of the abrasive grains acting is increased. According to this, it is considered that the polishing speed is accelerated.

In addition, when the object to be polished has a silicon-nitrogen bond, the action site of the organic compound of the present invention is a phosphonate group or a salt group thereof, the acceleration site thereof is also a phosphonate group or a salt group thereof, and sulfonic acid-immobilized silica is used as the abrasive grains, the organic compound is adsorbed or acts on the surface of the object to be polished so that bonding energy of the silicon-nitrogen bond is weakened. Thus, it is considered that the polishing speed is accelerated.

In the above-described embodiment, when the organic compound of the present invention is phenylphosphonic acid or a salt thereof, it is considered that the phosphonate group or the salt group thereof interacts as the action site with the object to be polished and the phenyl group acts as the acceleration site.

In the above-described embodiment, when the organic compound of the present invention is hydroxyethane-diphosphonic acid or a salt thereof, it is considered that one of the phosphonate groups or salt groups thereof interacts as the action site with the object to be polished and the other of the phosphonate groups or salt groups thereof and the hydroxyl group act as the acceleration site.

In the above-described embodiment, when the organic compound of the present invention is nitrilotrismethylene phosphonic acid or a salt thereof, considering the steric hindrance at the time of interaction with the object to be polished, two phosphonate groups or salt groups thereof interact as the action site with the object to be polished and the other one of the phosphonate groups or salt groups thereof acts as the acceleration site.

In the above-described embodiment, when the organic compound of the present invention is alendronic acid or a salt thereof (may be in the form of hydrate), it is considered that two phosphonate groups or salt groups thereof interact as the action site with the object to be polished and the (propyl)amino group and the hydroxyl group act as the acceleration site.

Further, in the above-described embodiment, when the organic compound of the present invention is (1-aminoethyl) phosphonic acid or a salt thereof, it is considered that the phosphonate group or the salt group thereof interacts as the action site with the object to be polished and the amino group acts as the acceleration site.

Further, in the above-described embodiment, when the organic compound of the present invention is N,N,N',N'-ethylenediamine tetrakis(methylene phosphonic acid) or a salt thereof, it is considered that three phosphonate groups or salt groups thereof interact as the action site with the object to be polished and the other one of the phosphonate groups or salt groups thereof acts as the acceleration site.

Further, in the above-described embodiment, when the organic compound of the present invention is glycine-N,N-bis(methylene phosphonic acid) or a salt thereof, it is considered that two phosphonate groups or salt groups thereof interact at least as the action site with the object to be polished and the carboxyl group acts as the acceleration site.

As described above, according to the preferred embodiment of the present invention, an organic compound having two properties: a reaction property of interacting with the surface of the silicon oxide film or the surface of the silicon nitride film; and a wet property of improving wettability between the polishing composition and the surface of the silicon oxide film or silicon nitride film by hydrophilizing the functional group at the contact liquid side is selected. According to this, it is possible to sufficiently improve the polishing speed of the object to be polished having a silicon-oxygen bond such as a silicon oxide film or the polishing speed of the object to be polished having a silicon-nitrogen bond such as a silicon nitride film.

Further, according to the preferred embodiment of the present invention, the interaction is preferably caused by chemical bonding selected from at least one of ion bonding, covalent bonding, and hydrogen bonding. When the interaction is caused, for example, by hydrophobic interaction or intermolecular force (Van der Waals force), there is a case where strong adsorption to the object to be polished having a silicon-oxygen bond or a silicon-nitrogen bond does not occur and thus the effect of the present invention is not exhibited.

Further, in the preferred embodiment of the present invention, from the viewpoint of weakening the Si—N bond by the interaction with the surface of the object to be polished having a silicon-nitrogen bond (for example, the surface of SiN) so as to maximize the effect of removing (polishing) with the abrasive grains, it is particularly preferable to accelerate the polishing speed of the object to be polished having a silicon-nitrogen bond in the acidic region (since SiN and the abrasive grains attract each other in the acidic region, the physical removal effect is maximized).

The content of the organic compound in the polishing composition of the present invention is not particularly limited as long as it is such an amount that the effect of the present invention is exhibited. In general, the content thereof is preferably 0.01 to 50 g/L, more preferably 0.05 to 20 g/L, further preferably 0.08 to 15 g/L, and still further preferably 0.1 to 10 g/L, and may be 0.3 to 3 g/L.

However, when the abrasive grains used in the present invention are silica (not subjected to surface modification), silica has a silanol group which is exposed, and thus at least the action site of the organic compound of the present invention may interact with the silica. For this reason, the action site of the organic compound of the present invention is consumed by the silica serving as the abrasive grains before the action site interacts with the object to be polished. Therefore, the content of the organic compound in the polishing composition of the present invention is preferably determined in consideration of the silanol group present on the surface of the silica (that is, in consideration of the entire area of the silica to be used).

In this regard, an equation in which the content of the organic compound of the present invention is derived as the minimum necessary concentration (that is, minimum concentration) corresponds to the following equation.

That is, according to the preferred embodiment of the present invention, the content of the organic compound of the present invention (the amount of the organic compound added per 1 g of silica) may be set to more than the minimum concentration, which is defined by the following equation, derived from the content of the silica.

[Mathematical Formula 1]

$$\text{Minimum concentration of organic compound per 1 g of silica} = \frac{A \times M}{B \times N} \ [g]$$

BET specific area of silica per 1 g: $A\,[m^2/g]$

Occupancy area of organic compound: $B\,[m^2/\text{count}]$

Molecular weight of organic compound: $M\,[g/\text{mol}]$

Avogadro's number: $N\,[\text{count/mol}]$

Further, in the present invention, it is sufficient that the polishing speed of the object to be polished having a silicon-oxygen bond or a silicon-nitrogen bond can be accelerated in any regions of the acidic, neutral, and basic regions.

However, in the preferred embodiment of the present invention, from the viewpoint of general versatility that the present invention can be applied to various use applications or in a case where the pH is changed, for example, when the control of the polishing efficiency of other polishing object is intended to be preferentially performed, it is particularly preferable to accelerate the polishing speed of the object to be polished having a silicon-oxygen bond in all the acidic, neutral, and basic regions.

Herein, as the occupancy area of the organic compound, a value calculated by Advanced Chemistry Development (ACD/Labs) Software V 11.02 (Copyright 1994-2011 ACD/Labs) is employed.

When the organic compound of the present invention is contained at a concentration higher than the minimum concentration, which is derived in the above-described manner and is consumed by silica, in the polishing composition, the desired effect of the present invention by the action site and the acceleration site of the organic compound may be exhibited.

In the preferred embodiment of the present invention, the organic compound is at least one of aryl phosphonic acid or a salt thereof and phosphonic acid, which contains at least one of a hydroxy group and a nitrogen atom, or a salt thereof. Further, in the preferred embodiment of the present invention, the organic compound is at least one type of phosphonic acid or a salt thereof selected from the group consisting of aryl phosphonic acid or a salt thereof, hydroxy group-containing phosphonic acid or a salt thereof, and nitrogen atom-containing phosphonic acid or a salt thereof. Incidentally, in the preferred embodiment of the present invention, the organic compound may be in the form of hydrate.

Herein, the structure of the aryl phosphonic acid or the salt thereof is not particularly limited as long as it exhibits the effect of the present invention, but preferably, aryl has hydrophilicity. If the aryl has hydrophilicity, the aryl may have a substituent. As such an aryl, the phenyl group is preferable as described above. Further, as such a substituent, a hydroxyl group, an amino group, a carboxyl group, or the like is considered to be preferable. Among these, a phenyl group having a hydroxyl group as a substituent is particularly preferable.

Further, the number of hydroxy groups in the hydroxy group-containing phosphonic acid or a salt thereof is not particularly limited, but is preferably 1 to 3 and more preferably 1 to 2. Furthermore, the number of phosphonic acids or salts thereof is also not particularly limited, but is preferably 1 to 3 and more preferably 2 to 3.

Further, the structure of the nitrogen atom-containing phosphonic acid or the salt thereof is also not particularly limited as long as it is phosphonic acid containing a nitrogen atom or a salt thereof. Furthermore, the number of phosphonic acids or salts thereof is not particularly limited, but may be 1 to 5, 1 to 4, or 2 to 3. The nitrogen atom-containing phosphonic acid or the salt thereof preferably has a nitrile structure or a tertiary amine structure. Furthermore, the number of nitrogen atoms is not particularly limited, but is preferably 1 to 4 and more preferably 1 to 3.

Further, the structure of the phosphonic acid containing a hydroxy group and a nitrogen atom or the salt thereof is also not particularly limited. Furthermore, the number of hydroxy groups is not particularly limited, but is preferably 1 to 3 and more preferably 1 to 2. Furthermore, the number of nitrogen atoms is not particularly limited, but is preferably 1 to 4 and more preferably 1 to 3. The number of phosphonic acids or salts thereof is also not particularly limited, but is preferably 1 to 4 and more preferably 1 to 3.

As described above, in the particularly preferred embodiment of the present invention, the organic compound is at least one selected from the group consisting of phenylphosphonic acid or a salt thereof, hydroxyethane-diphosphonic acid or a salt thereof, nitrilotrismethylene phosphonic acid or a salt thereof, nitrilotrismethylene phosphonic acid or a salt thereof, a trihydrate of alendronic acid or a salt thereof, alendronic acid or a salt thereof, (1-aminoethyl)phosphonic acid or a salt thereof, N,N,N',N'-ethylenediamine tetrakis (methylene phosphonic acid) or a salt thereof, and glycine N,N-bis(methylene phosphonic acid) or a salt thereof.

As described above, according to the preferred embodiment of the present invention, in the organic compound of the present invention, the action site is chemically bonded to the surface of the object to be polished having a silicon-oxygen bond or a silicon-nitrogen bond, and at the other side, the acceleration site accelerates an access of the component polishing an object to be polished to the object to be polished. For this reason, according to the present invention containing such an organic compound, it is possible to sufficiently accelerate the polishing speed of the object to be polished having a silicon-oxygen bond such as a silicon oxide film or the polishing speed of the object to be polished having a silicon-nitrogen bond such as a silicon nitride film.

(2) [Abrasive Grains]

The polishing composition of the present invention contains abrasive grains.

The abrasive grains used may be any of inorganic particles, organic particles, and organic-inorganic composite particles. Specific examples of the inorganic particles include particles composed of a metal oxide such as silica, alumina, ceria, titania and the like, and silicon nitride particles, silicon carbide particles, and boron nitride particles. Specific examples of the organic particles include latex particles, polystyrene particles, and polymethyl methacrylate (PMMA) particles. The abrasive grains may be used either singly or in mixture of two or more kinds thereof. Moreover, the abrasive grains used may be a commercially available product or a synthesized product.

The abrasive grains has a function which scraps an object to be polished so that the object to be polished is removed by a mechanical action, but this mechanical action is affected by materials, shapes, particle sizes, and particle size distribution of the abrasive grains. The mechanical action is increased in the case of abrasive grains having a high Mohs hardness or a material which is difficult to crush, and thus the polishing speed of the object to be polished having a silicon-oxygen bond such as a silicon oxide film or the object to be polished having a silicon-nitrogen bond such as a silicon nitride film is accelerated. Regarding the shape of the particles, in the case of particles without surface unevenness and close to a true sphere, the catching on the object to be polished is weakened. For this reason, abrasive grains having a certain degree of aspect ratio can improve the polishing speed of the object to be polished having a silicon-oxygen bond such as a silicon oxide film or the object to be polished having a silicon-nitrogen bond such as a silicon nitride film.

Since abrasive grains having a relatively large particle size tend to cause the strain applied to the surface of the object to be polished to increase, the abrasive grains can accelerate the polishing speed of the object to be polished having a silicon-oxygen bond such as a silicon oxide film or the object to be polished having a silicon-nitrogen bond such as a silicon nitride film. In addition, since abrasive grains having a large width in the particle size distribution can increase the force applied to one particle, the abrasive grains can improve the polishing speed of the object to be polished having a silicon-oxygen bond such as a silicon oxide film or the object to be polished having a silicon-nitrogen bond such as a silicon nitride film.

In particular, for example, when the zeta potential of abrasive grains becomes an opposite sign to the object to be polished, the electrostatic repulsive force acting between the abrasive grains (particles) and the surface of the object to be polished (substrate) is decreased or the electrostatic attraction force is increased so that the polishing speed of the object to be polished can be improved.

However, when the polishing rate of the object to be polished is improved by adjusting the mechanical action with these techniques, the polishing efficiency of other types of film is also improved in many cases. Thus, it is desirable to control the polishing efficiency by the effect of an additive. In this point of view, it can be said that the present invention is excellent.

Among the abrasive grains, silica is preferable, and from the viewpoint of suppressing the generation of polishing scratches, colloidal silica is particularly preferable.

In particular, when the action site of the organic compound of the present invention is a phosphonate group or a salt group thereof, the acceleration site thereof has a functional group having hydrophilicity, and the functional group having hydrophilicity is at least one selected from the group consisting of an amino group, a hydroxyl group, a phosphonate group or a salt group thereof, a carboxyl group or a salt group thereof, a phosphate group or a salt group thereof, a sulfate group or a salt group thereof, a phenyl group, and a group represented by the following Formula (1) or a salt group thereof:

[Chemical Formula 2]

—(O-E)$_n$-H    (1)

wherein in Formula (1), E is an alkylene group having 1 to 3 carbon atoms and n is an integer of 1 to 15, wettability of the polishing composition and the object to be polished is improved by hydrophilizing the functional group at the contact liquid side as well as reaction characteristics of interaction with the surface of the silicon oxide film or the surface of the silicon nitride film are improved. For this reason, silica easily acts on the surface of the object to be polished to increase the number of the abrasive grains to be used. Thus, the polishing speed is accelerated. In this point of view, silica (particularly, colloidal silica) is particularly preferable in view of the technical idea of the present invention.

Incidentally, the type of colloidal silica which may be used is not particularly limited, but for example, surface-modified colloidal silica may also be used. The surface modification of colloidal silica (supported colloidal silica) can be performed, for example, by mixing a metal such as aluminum, titanium, or zirconium or an oxide thereof with colloidal silica and doping the surface of the silica particles with the mixture. Alternatively, surface modification of colloidal silica can also be performed by chemically bonding the functional group of organic acid to the surface of the silica particles, that is, by immobilizing the organic acid.

However, when the object to be polished has a silicon-oxygen bond, in consideration of the reaction with the acceleration site (particularly, a phosphonate group), it is preferable that surface modification is not performed and the silanol group on the surface of silica is exposed. On the other hand, when the object to be polished has a silicon-nitrogen bond, in consideration of attraction between the object to be polished and the zeta potential of the abrasive grains, it is preferable to use surface-modified colloidal silica. Therefore, according to the preferred embodiment of the present invention, when the object to be polished has a silicon-nitrogen bond, the abrasive grains are sulfonic acid-immobilized silica.

Incidentally, the immobilization of an organic acid cannot be accomplished by only allowing colloidal silica to simply coexist with an organic acid. It is possible to perform the immobilization, for example, by the method described in "sulfonic acid-functionalized silica through of thiol groups," Chem. Commun. 246-247 (2003) when sulfonic acid of a kind of organic acids is immobilized on colloidal silica. Specifically, it is possible to obtain colloidal silica having sulfonic acid immobilized on the surface by coupling a silane coupling agent having a thiol group such as 3-mercaptopropyltrimethoxysilane to colloidal silica and then oxidizing the thiol group with hydrogen peroxide. Also, in colloidal silica used in Examples, a sulfonate group is modified in this way.

Alternatively, it is possible to perform the immobilization, for example, by the method described in "Novel Silane Coupling Agents Containing a Photolabile 2-Nitrobenzyl Ester for Introduction of a Carboxy Group on the Surface of Silica Gel," Chemistry Letters, 3, 228-229 (2000) when carboxylic acid of a kind of organic acids is immobilized on colloidal silica. Specifically, it is possible to obtain colloidal silica having carboxylic acid immobilized on the surface by coupling a silane coupling agent containing a photoreactive 2-nitrobenzyl ester to colloidal silica and then irradiating with light.

The lower limit of the average primary particle size of the abrasive grains (or surface-modified abrasive grains) in the polishing composition is preferably 5 nm or more, more preferably 7 nm or more, and further preferably 10 nm or more, and may be 20 nm or more. In addition, the upper limit of the average primary particle size of the abrasive grains (or surface-modified abrasive grains) is preferably 200 nm or less, more preferably 150 nm or less, further preferably 100 nm or less, still further preferably 70 nm or less, and particularly preferably 50 nm or less, and may be 25 nm or less. With such a range, the defect such as scratches on the surface of the object to be polished after being polished by using the polishing composition can be suppressed. Incidentally, the average primary particle size of the abrasive grains is calculated, for example, based on the specific surface area of the abrasive grains measured by the BET method.

The lower limit of the average secondary particle size of the abrasive grains (or surface-modified abrasive grains) in the polishing composition is preferably 5 nm or more, more preferably 7 nm or more, further preferably 10 nm or more, and still further preferably 18 nm or more, and may be 30 nm or more or 50 nm or more. In addition, the upper limit of the average secondary particle size of the abrasive grains (or surface-modified abrasive grains) is preferably 300 nm or less, more preferably 260 nm or less, further preferably 220 nm or less, still further preferably 180 nm or less, still further preferably 130 nm or less, still further preferably 100 nm or less, and particularly preferably 80 nm or less, and may be 50 nm or less or 30 nm or less. With such a range, the occurrence of the surface defect on the surface of the object to be polished after being polished by using the polishing composition can be further suppressed. In particular, it is considered that when the average secondary particle size of the abrasive grains (or surface-modified abrasive grains) is increased, the polishing speed of the object to be polished can be accelerated. Incidentally, the secondary particles mentioned here refer to the particles formed by the association of the abrasive grains (or surface-modified abrasive grains) in the polishing composition, and the average secondary particle size of these secondary particles can be measured, for example, by a dynamic light scattering method represented by a laser diffraction scattering method.

The lower limit of the ratio of the diameter D90 of particles when the cumulative particle mass from the fine particle side reaches 90% of the total particle mass to the diameter D10 of particles when cumulative particle mass from the fine particle side reaches 10% of the total particle mass of the entire particles (in the specification, simply also referred to as "D90/D10") is preferably 1.1 or more, more preferably 1.2 or more, further preferably 1.3 or more, still further preferably 1.4 or more, and particularly preferably 1.5 or more in a particle size distribution of the abrasive grains (or surface-modified abrasive grains) in the polishing composition determined by a laser diffraction scattering method. In addition, the upper limit of D90/D10 is not particularly limited, but is preferably 5.0 or less, more preferably 3.0 or less, further preferably 2.5 or less, still further preferably 2.0 or less, and particularly preferably 1.8 or less. With such a range, the occurrence of the surface defect on the surface of the object to be polished after being polished by using the polishing composition can be further suppressed. A case where D90/D10 is small (near 1.0) indicates that the particle size distribution width is narrow, and as the value increases, the width of the particle size distribution is increased. Regarding the influence of the value of D90/D10 on the polishing efficiency of the object to be polished, as D90/D10 increases, the stress applied to one particle (application point) is dispersed (the force is uniformly applied to each application point). From this reason, it is considered that as the value of D90/D10 increases, the acceleration effect of the polishing speed is increased.

The lower limit of the content of the abrasive grains (or surface-modified abrasive grains) in the polishing composition is preferably 0.01% by mass or more, more preferably 0.05% by mass or more, further preferably 0.1% by mass or more, still further preferably 1% by mass or more, still further preferably 2% by mass or more, and particularly preferably 3% by mass or more.

Further, the upper limit of the content of the abrasive grains (or surface-modified abrasive grains) in the polishing composition is preferably 50% by mass or less, more preferably 30% by mass or less, further preferably 20% by mass or less, and still further preferably 10% by mass or less. When the upper limit is in this range, the cost of the polishing composition can be suppressed, and the occurrence of the surface defect on the surface of the object to be polished after being polished by using the polishing composition can be further suppressed. In addition, when the upper limit is in this range, the effect of suppressing a polishing speed of an object to be polished other than the object to be polished having a silicon-oxygen bond such as a silicon oxide film or a silicon-nitrogen bond such as a silicon nitride film is expected.

(3) [Dispersing Medium]

In the polishing composition of the present invention, a dispersing medium for dispersing each component is used. As the dispersing medium, an organic solvent and water are considered, and of them, it is preferable to contain water.

Water containing impurities as little as possible is preferable from the viewpoint of the inhibition of contamination of the object to be polished and the inhibition of the impurities on the action of other components. Specifically, pure water, ultrapure water, or distilled water from which the impurity ions are removed by an ion exchange resin and the foreign matters are removed through filtration is preferable.

[Polishing Object]

As described above, in the present invention, there is provided a polishing composition which sufficiently improves the polishing speed of the object to be polished having a silicon-oxygen bond or a silicon-nitrogen bond.

Examples of the object to be polished having a silicon-oxygen bond include a silicon oxide film, BD (black diamond: SiOCH), FSG (fluorosilicate glass), HSQ (hydrogen silsesquioxane), CYCLOTENE, SiLK, and MSQ (methyl silsesquioxane).

Examples of the object to be polished having a silicon-nitrogen bond include a silicon nitride film and SiCN (silicon carbonitride).

[Other Components]

The polishing composition of the present invention may further contain, if necessary, other components such as a pH adjusting agent, an oxidant, a reducing agent, a surfactant, a water-soluble polymer, and an antifungal agent.

Hereinafter, a pH adjusting agent, an oxidant, a reducing agent, a surfactant, a water-soluble polymer, and an antifungal agent will be described.

Incidentally, if a compound has the action site interacting with the object to be polished and the acceleration site accelerating an access of a component polishing an object to be polished to the object to be polished and also acts as "another component," in the present invention, this compound is classified into the organic compound of the present invention.

(pH Adjusting Agent)

The polishing composition of the present invention accelerates the polishing speed of the object to be polished in any regions of the acidic, neutral, and basic regions. Thus, the pH adjusting agent is preferably used for adjusting the pH to the acidic or basic region.

The acidic region in the present invention means a pH of below 7, preferably a pH of below 2.2. The lower limit of the pH is preferably 1 or above and more preferably 1.3 or above. In particular, when the pH in the acidic region is below 2.2, the polishing speed of the object to be polished can be significantly improved. According to the preferred embodiment of the present invention, the polishing composition is adjusted in the acidic region having a pH of below 2.2, the neutral region, or the basic region. In addition, the neutral region in the present invention means a pH of 7. Further, the basic region in the present invention means a pH of above 7, preferably a pH of 8 to 13. Incidentally, the value of the pH in the present invention indicates a value measured in the condition described in Examples.

As a specific example of the pH adjusting agent for adjustment to the acidic region, any of an inorganic compound and an organic compound may be used, but examples thereof include inorganic acid such as sulfuric acid, nitric acid, boric acid, carbonic acid, hypophosphoric acid, phosphorous acid, or phosphoric acid; organic acids such as carboxylic acids, for example, citric acid, formic acid, acetic acid, propionic acid, benzoic acid, salicylic acid, glyceric acid, oxalic acid, malonic acid, succinic acid, maleic acid, phthalic acid, malic acid, tartaric acid, or lactic acid, or such as organic sulfuric acids, for example, methanesulfonic acid, ethanesulfonic acid, or isethionic acid. In addition, when the acid is divalent or higher acid (for example, sulfuric acid, carbonic acid, phosphoric acid, oxalic acid, or the like), the form of a salt may be employed as long as one or more protons ($H^+$) can be discharged. Specific examples thereof include ammonium hydrogen carbonate and ammonium hydrogen phosphate (although the type of counter cation is basically not limited, weakly basic cation (ammonium, triethanolamine, or the like) is preferable).

As a specific example of the pH adjusting agent for adjustment to the basic region, any of an inorganic compound and an organic compound may be used, but examples thereof include a hydroxide or salt of an alkali metal, quaternary ammonium, a quaternary ammonium hydroxide or a salt thereof, ammonia, and amine.

Specific examples of the alkali metal include potassium and sodium. Specific examples of the salt include carbonate, hydrogen carbonate, sulfate, and acetate.

Specific examples of the quaternary ammonium include tetramethylammonium, tetraethylammonium, and tetrabutylammonium.

Specific examples of the quaternary ammonium hydroxide or the salt thereof include tetramethylammonium hydroxide, tetraethylammonium hydroxide, and tetrabutylammonium hydroxide.

Among them, from the viewpoint of metallic contamination prevention or ease of diffusion of metallic ions in the semiconductor device structure, the polishing composition further preferably contains ammonia, amine, and potassium as a base. Specifically, potassium hydroxide, potassium carbonate, potassium hydrogen carbonate, potassium sulfate, potassium acetate, potassium chloride, and the like are mentioned.

(Oxidant)

Further, the polishing composition of the present invention preferably contains an oxidant when a metallic material other than the silicon oxide film or the silicon nitride film is simultaneously polished.

Specific examples of the oxidant include hydrogen peroxide, peracetic acid, percarbonate, urea peroxide, perchloric acid; persulfate such as sodium persulfate, potassium persulfate, ammonium persulfate, potassium monopersulfate, or oxone ($2KHSO_5 \cdot KHSO_4 \cdot K_2SO_4$) which is a double salt with peroxide, a halogen-based oxidant such as hypochlorite, chlorite, chlorate, perchlorate, hypobromite, bromite, bromate, perbromate, hypoiodite, iodite, iodate, or periodate, and a metallic element compound, which may have a wide range of oxidation number, such as cerium ammonium nitrate, potassium permanganate, or potassium chromate. These oxidants may be used either singly or in mixture of two or more kinds thereof.

The lower limit of the content (concentration) of the oxidant in the polishing composition is preferably 0.001% by mass or more and more preferably 0.01% by mass or more. When the lower limit is set in this range, there is an advantage in that the polishing efficiency can be increased without increasing the concentration of the abrasive grains when the object to be polished in which the polishing efficiency is to be improved by adding an oxidant is polished. In addition, the upper limit of the content (concentration) of the oxidant in the polishing composition is preferably 30% by mass or less and more preferably 10% by mass or less. When the upper limit is set in this range, there is an advantage in that the load of the treatment of the polishing composition after being used in polishing, that is, the waste water treatment can be reduced as well as an advantage in that the material cost of the polishing composition can be suppressed. Further, there is also an advantage in that excessive oxidation on the surface of the object to be polished caused by the oxidant less likely occurs.

(Reducing Agent)

Further, the polishing composition of the present invention may contain, if necessary, a reducing agent. Well-known reducing agents used in the polishing composition can be contained as the reducing agent, and examples thereof include an organic substance such as hydrazine, formic acid, oxalic acid, aqueous formaldehyde solution, ascorbic acid, or reducing sugars such as glucose; an inorganic substance such as nitrous acid and a salt thereof, phosphorous acid and a salt thereof, hypophosphoric acid and a salt thereof, sulfurous acid and a salt thereof, thiosulfuric acid and a salt thereof, lithium aluminum hydride, sodium boron hydride, and a metal having a plurality of stable valences and a compound thereof. When oxidation of an arbitrary metal is suppressed by the reducing agent, the corrosion of the metal can be suppressed or the polishing efficiency can be controlled.

The lower limit of the content (concentration) of the reducing agent in the polishing composition is preferably 0.001% by mass or more and more preferably 0.01% by mass or more. When the lower limit is set in this range, there is an advantage in that the polishing efficiency can be increased without increasing the concentration of the abrasive grains when the object to be polished in which the polishing efficiency is to be improved by adding a reducing agent is polished. In addition thereto, when the reducing agent is added, the corrosion occurring when an arbitrary metal is contained in the object to be polished can be suppressed. Further, the upper limit of the content (concentration) of the reducing agent in the polishing composition is preferably 30% by mass or less and more preferably 10% by mass or less. When the upper limit is set in this range, there is an advantage in that the load of the treatment of the polishing composition after being used in polishing, that is, the waste water treatment can be reduced as well as an advantage in that the material cost of the polishing composition can be suppressed.

(Surfactant)

From the viewpoint of lowering viscosity, a surfactant is preferably contained in the polishing composition. The surfactant provides hydrophilicity to the polishing surface after being polished to improve the cleaning efficiency after polishing and can prevent contamination from being attached, or the like. In addition, the contact liquid property of the polishing composition is improved. Moreover, in addition to the improvement in cleaning property, the step performance such as dishing can also be improved by selecting an appropriate surfactant.

The surfactant may be any of an anionic surfactant, a cationic surfactant, an amphoteric surfactant, and a nonionic surfactant. These surfactants may be used either singly or in combination of two or more kinds thereof.

The content of the surfactant in the polishing composition is preferably 0.001 g/L or more and more preferably 0.005 g/L or more. With such a lower limit, the cleaning effect after polishing is further improved. In addition, by selecting an appropriate surfactant, the step performance such as dishing can also be improved.

(Water-Soluble Polymer)

The polishing composition of the present invention also preferably contains a water-soluble polymer.

The water-soluble polymer refers to a water-soluble polymer such that when the water-soluble polymer is dissolved in water at a concentration of 0.5% by mass at a temperature at which the water-soluble polymer is most dissolved, the mass of an insoluble matter that is separated by filtration by means of a G2 glass filter (maximum pore size: 40 to 50 μm) is within 50% by mass of the added water-soluble polymer.

When the water-soluble polymer is added into the polishing composition, the surface roughness of the object to be polished after being polished by using the polishing composition is further decreased. These water-soluble polymers may be used either singly or in combination of two or more kinds thereof.

The content of the water-soluble polymer in the polishing composition is preferably 0.01 g/L or more and more preferably 0.05 g/L or more. With such a lower limit, the surface roughness of the polishing surface by the polishing composition is further decreased.

The content of the water-soluble polymer in the polishing composition is preferably 100 g/L or less and more preferably 50 g/L or less. With such an upper limit, the amount of the water-soluble polymer remaining on the polishing surface is decreased and thus the cleaning effect is further improved.

(Antifungal Agent)

Examples of an antiseptic agent and an antifungal agent which may be added to the polishing composition according to the present invention include an isothiazolin-based antiseptic agent such as 2-methyl-4-isothiazolin-3-one or 5-chloro-2-methyl-4-isothiazolin-3-one, paraoxybenzoate ester, and phenoxyethanol. These antiseptic agents and antifungal agents may be used either singly or in mixture of two or more kinds thereof.

As described above, particularly, with a configuration in which the organic compound, which has an action site interacting with an object to be polished having a silicon-oxygen bond or a silicon-nitrogen bond and a acceleration site accelerating an access of a component polishing an object to be polished to the object to be polished, is contained in the polishing composition, it is possible to sufficiently accelerate the polishing speed of the object to be polished having a silicon-oxygen bond such as a silicon oxide film or a silicon-nitrogen bond such as a silicon nitride film.

The polishing speed of the object to be polished having a silicon-oxygen bond such as a silicon oxide film under an acidic environment is preferably 600 [Å/min] or more, more preferably 650 [Å/min] or more, and further preferably 700 [Å/min] or more.

The polishing speed of the object to be polished having a silicon-oxygen bond such as a silicon oxide film under a neutral environment is preferably 500 [Å/min] or more, more preferably 540 [Å/min] or more, further preferably 600 [Å/min] or more, still further preferably 650 [Å/min] or more, and particularly preferably 700 [Å/min] or more.

The polishing speed of the object to be polished having a silicon-oxygen bond such as a silicon oxide film under a basic environment is preferably 550 [Å/min] or more, more preferably 600 [Å/min] or more, further preferably 650 [Å/min] or more, still further preferably 700 [Å/min] or more, and particularly preferably 750 [Å/min] or more.

The polishing speed of the object to be polished having a silicon-nitrogen bond such as a silicon nitride film under an acidic environment is preferably more than 545 [Å/min], more preferably 580 [Å/min] or more, further preferably 650 [Å/min] or more, and still further preferably 700 [Å/min] or more.

Incidentally, the polishing speed means a value measured by a method described in Examples.

Further, the technical effect of the present invention is not limited to those described above, and there is not only an effect in which when a metal (for example, tungsten, copper, or aluminum) is contained in the object to be polished, but also the polishing speed can be suppressed because the oxidation of these metals is suppressed as well as the effect in which the object to be polished having a silicon-oxygen bond such as a silicon oxide film or the object to be polished having a silicon-nitrogen bond such as a silicon nitride film can be sufficiently improved in this way.

<Method for Producing Polishing Composition>

In the present invention, there is provided a method for producing a polishing composition which accelerates a polishing speed of an object to be polished having a silicon-oxygen bond or a silicon-nitrogen bond, the method including: mixing (1) an organic compound; (2) abrasive grains; and (3) a dispersing medium, in which the organic compound has an action site interacting with an object to be polished having a silicon-oxygen bond or a silicon-nitrogen bond and an acceleration site accelerating an access of a component polishing an object to be polished to the object to be polished.

The method for producing a polishing composition is not particularly limited, but the polishing composition can be obtained by stirring and mixing respective components constituting the polishing composition of the present invention, and if necessary, another component in the dispersing medium.

The temperature at the time of mixing each component is not particularly limited, but is preferably 10 to 40° C. The components may be heated in order to increase a rate of dissolution. Further, the mixing time is not particularly limited, either.

<Polishing Method>

In the present invention, there is provided a method for polishing an object to be polished having a silicon-oxygen bond or a silicon-nitrogen bond by the above-described polishing composition or a polishing composition obtained by the above-described producing method.

As a polishing apparatus, it is possible to use a general polishing apparatus to which a holder for holding a substrate or the like having an object to be polished and a motor with a changeable rotating speed and the like are attached, having a polishing table to which a polishing pad (polishing cloth) can be attached.

As the polishing pad, a general nonwoven fabric, polyurethane, a porous fluororesin, or the like can be used without any particular limitation. The polishing pad is preferably grooved such that the polishing composition can be stored therein.

Polishing conditions are not particularly limited, either. For example, the rotational speed of the polishing table is preferably 10 to 500 rpm, the carrier rotational speed is preferably 10 to 500 rpm, and the pressure (the polishing pressure) applied to a substrate having an object to be polished is preferably 0.1 to 10 psi. A method for supplying a polishing composition to a polishing pad is not particularly limited, either. For example, a method in which a polishing composition is supplied continuously by using a pump or the like is employed. The supply amount is not limited, but a surface of the polishing pad is preferably covered all the time with the polishing composition of the present invention.

<Method for Accelerating Polishing Speed of Polishing Object Having Silicon-Oxygen Bond or Silicon-Nitrogen Bond>

In the present invention, there is also provided a method for accelerating a polishing speed of an object to be polished having a silicon-oxygen bond or a silicon-nitrogen bond by polishing the object to be polished using a polishing composition, which contains (1) an organic compound which has an action site interacting with an object to be polished having a silicon-oxygen bond or a silicon-nitrogen bond and an acceleration site accelerating an access of a component polishing an object to be polished to the object to be polished; (2) abrasive grains; and (3) a dispersing medium. That is, in the present invention, there is also provided a method for accelerating a polishing speed of an object to be polished having a silicon-oxygen bond or a silicon-nitrogen bond by polishing the object to be polished using the polishing composition.

Since the specific descriptions for the constitutional elements of such invention are the same as those given above, further descriptions are omitted herein.

EXAMPLES

The present invention will be described in more detail by means of the following Examples and Comparative Examples. However, the technical scope of the present invention is not limited only to the following Examples.

(1) Example 1: Case where Polishing Object is Wafer Attached with Silicon Oxide Film <Preparation of Polishing Composition>
6% by mass of abrasive grains (colloidal silica; average primary particle size: 35 nm, average secondary particle size: 65 nm, D90/D10: 1.6) (BET specific surface area per 1 g: 80.5 m²/g),
a pH adjusting agent, and
an organic compound (additive)
were mixed in a dispersing medium (pure water) to have the composition presented in Table 1-1, thereby preparing a polishing composition (mixing temperature: about 25° C., mixing time: about 10 min).

Incidentally, the pH was adjusted by selecting and adding an appropriate amount of nitric acid and KOH such that the pH of the polishing composition was set to 2.1, 4.0, 7, and 10.

The pH of the polishing composition (liquid temperature: 25° C.) was confirmed by a pH meter (model No.: LAQUA manufactured by HORIBA, Ltd.).

<Polishing Performance Evaluation>
The polishing speed when the object to be polished (the wafer attached with a silicon oxide film) was polished by using the polishing composition obtained above under the following polishing conditions was measured.

(Polishing Conditions)
Polishing machine: Polishing machine with single-side CMP (ENGIS)
Polishing pad: Polyurethane pad (IC1010: manufactured by Rohm And Haas Company)
Pressure: 3.04 psi
Conditioner (dresser): Nylon brush
Platen rotation number: 93 rpm
Head (carrier) rotation number: 87 rpm
Flow rate of polishing composition: 200 ml/min
Polishing time: 60 sec (Polishing Speed)
The polishing speed (polishing rate) was calculated by the following equation.

[Mathematical Formula 2]

$$\text{Polishing rate [Å/min]} = \frac{\text{Film thickness before polishing [Å]} - \text{Film thickness after polishing [Å]}}{\text{Polishing time [min]}}$$

The film thicknesses were obtained by an optical interferometric film thickness measurement apparatus (Model No.: ASET manufactured by KLA-Tencor Corporation) and evaluation was carried out by dividing a difference between the film thicknesses by the polishing time.

The measurement result of the polishing speed is presented in the following Table 1-1. In addition, the minimum concentration (theoretical value) derived from the content of silica (colloidal silica) is presented in Table 2-1.

TABLE 1

| Example/Comparative Example | Abrasive grains | Amount of abrasive grains added [g/L] | Additive | Concentration of additive [g/L] | Polishing speed of silicon oxide film [Å/min] pH 2.1 | pH 4.0 | pH 7 | pH 10 | Mass of additive per 1 g of abrasive grains |
|---|---|---|---|---|---|---|---|---|---|
| Example | Colloidal silica | 60 | Phenylphosphonic acid | 0.5 | 694 | 690 | 707 | 732 | 8.3 mg |
| Example | Colloidal silica | 60 | Hydroxyethane-diphosphonic acid | 0.5 | 773 | 770 | 690 | 792 | 8.3 mg |
| Example | Colloidal silica | 60 | Nitrilotrismethylene phosphonic acid | 0.5 | 681 | 672 | 678 | 691 | 8.3 mg |
| Example | Colloidal silica | 60 | Alendronate sodium trihydrate | 0.5 | 712 | 700 | 666 | 611 | 8.3 mg |
| Example | Colloidal silica | 60 | Alendronic acid | 0.5 | 698 | 666 | 528 | 568 | 8.3 mg |
| Example | Colloidal silica | 60 | (1-Aminoethyl)phosphonic acid | 0.5 | 700 | 682 | 541 | 639 | 8.3 mg |
| Example | Colloidal silica | 60 | N,N,N',N'-ethylenediamine tetrakis(methylene phosphonic acid) | 0.5 | 711 | 700 | 500 | 690 | 8.3 mg |
| Example | Colloidal silica | 60 | Glycine-N,N-bis(methylene phosphonic acid) | 0.5 | 724 | 721 | 507 | 607 | 8.3 mg |
| Comparative Example | Colloidal silica | 60 | No additive | None | 478 | 345 | 345 | 471 | None |
| Comparative Example | Colloidal silica | 60 | Ammonium lauryl sulfate | 0.8 | 342 | 340 | 340 | 389 | 13.3 mg |
| Comparative Example | Colloidal silica | 60 | POE ammonium lauryl sulfate (POE* = 12) | 1 | 333 | 333 | 338 | 375 | 16.7 mg |
| Comparative Example | Colloidal silica | 60 | Sodium lauryl phosphate | 0.7 | 46 | 43 | 333 | 280 | 11.7 mg |
| Comparative Example | Abrasive grains | 60 | POE sodium lauryl phosphate (POE* = 15) | 1 | 359 | 333 | 341 | 312 | 16.7 mg |

*POE: "polyoxyethylene"
Incidentally, "POE* = 12" means that the number of the oxyethylene groups is 12.
"POE* = 15" means that the number of the oxyethylene groups is 15.

TABLE 2-1

| | | Mass of additive per 1 g of abrasive grains | Minimum concentration theoretical value |
|---|---|---|---|
| Example | Phenylphosphonic acid | 8.3 mg | 2.2 mg |
| Example | Hydroxyethane-diphosphonic acid | 8.3 mg | 3.2 mg |
| Example | Nitrilotrismethylene phosphonic acid | 8.3 mg | 2.5 mg |
| Example | Alendronate sodium trihydrate | 8.3 mg | 3.4 mg |
| Example | Alendronic acid | 8.3 mg | 3.4 mg |
| Example | (1-Aminoethyl)phosphonic acid | 8.3 mg | 2.0 mg |
| Example | N,N,N',N'-ethylenediamine tetrakis(methylene phosphonic acid) | 8.3 mg | 2.7 mg |
| Example | Glycine-N,N-bis(methylene phosphonic acid) | 8.3 mg | 2.9 mg |
| Comparative Example | No additive | None | — |
| Comparative Example | Ammonium lauryl sulfate | 13.3 mg | 2.4 mg |
| Comparative Example | POE ammonium lauryl sulfate (POE* = 12) | 16.7 mg | 6.2 mg |
| Comparative Example | Sodium lauryl phosphate | 11.7 mg | 6.8 mg |
| Comparative Example | POE sodium lauryl phosphate (POE* = 15) | 16.7 mg | 6.4 mg |

As clearly understood from Table 1-1, it is found that according to the polishing composition of the present invention, the polishing speed of the silicon oxide film can be significantly improved as compared to the polishing compositions of Comparative Examples. Incidentally, since it is generally known that the silanol group and phosphonic acid are chemically bonded to each other, the "interaction" of the organic compound of this Example is not caused by physical bonding but is considered to be caused by chemical bonding selected from at least one of ion bonding, covalent bonding, and hydrogen bonding.

Further, it is particularly important in the present invention that the pH of the polishing composition is 7 (neutral), and generally, even in the condition in which the polishing speed is difficult to increase, the polishing speed of the silicon oxide film can be significantly improved as compared to the polishing compositions of Comparative Examples.

Further, as described above, it is suggested that since the polishing compositions of Comparative Examples do not have at least one of the action site and the acceleration site, the polishing speed of the silicon oxide film cannot be improved. Instead, it is suggested that as compared to Comparative Example 1, the polishing speed of the silicon oxide film is suppressed, and thus these organic compounds have the structure of suppressing the polishing speed of the silicon oxide film. Hereinafter, description will be made in more detail.

Since ammonium lauryl sulfate has a sulfate group and POE ammonium lauryl sulfate has a sulfate group and a polyoxyethylene site, these additives are considered to have a acceleration site. However, since these additives do not have an action site interacting with the object to be polished, it is considered that the polishing speed is not improved.

Since POE sodium lauryl phosphate has a polyoxyethylene site and a phosphate group, these are considered to have a acceleration site. However, since there is no action site interacting with the object to be polished, it is considered that the polishing speed is not improved.

Since sodium lauryl phosphate has a phosphate group, these are considered to have a acceleration site. However, since there is no action site interacting with the object to be polished, it is considered that the polishing speed is not improved.

In this way, in the present invention, it is suggested that it is essential to have both the action site and the acceleration site.

(2) Example 2: Case where Polishing Object is Silicon Nitride Film

<Preparation of Polishing Composition>

3% by mass of abrasive grains (colloidal silica having sulfonic acid immobilized on the surface thereof) (average primary particle size: 12 nm, average secondary particle size: 23 nm, D90/D10: 1.78) (BET specific surface area per 1 g: 201 m$^2$/g),
a pH adjusting agent, and
an organic compound (additive)
were mixed in a dispersing medium (pure water) to have the composition presented in Table 1-2, thereby preparing a polishing composition (mixing temperature: about 25° C., mixing time: about 10 min).

Incidentally, the pH was adjusted by selecting and adding an appropriate amount of maleic acid such that the pH of the polishing composition was set to 1.5 and 3.0.

The pH of the polishing composition (liquid temperature: 25° C.) was confirmed by a pH meter (model No.: LAQUA manufactured by HORIBA, Ltd.).

<Polishing Performance Evaluation>

The polishing speed when the silicon nitride film (the wafer in which SiN is formed on SiO$_2$ by a CVD method) as an object to be polished was polished by using the polishing composition obtained above under the following polishing conditions was measured.

(Polishing Conditions)
Polishing machine: Mirra-200 mm polishing machine (Applied Materials, Inc.: AMAT)
Polishing pad: Polyurethane pad (IC1010: manufactured by Rohm And Haas Company)
Pressure: 3.0 psi
Platen rotation number: 93 rpm
Head (carrier) rotation number: 87 rpm
Flow rate of polishing composition: 130 ml/min
Polishing time: 60 sec
(Polishing Speed)
The polishing speed (polishing rate) was calculated by the following equation.

[Mathematical Formula 3]

$$\text{Polishing rate [Å/min]} = \frac{\text{Film thickness before polishing [Å]} - \text{Film thickness after polishing [Å]}}{\text{Polishing time [min]}}$$

The film thicknesses were obtained by an optical interferometric film thickness measurement apparatus (Model No.: ASET manufactured by KLA-Tencor Corporation) and evaluation was carried out by dividing a difference between the film thicknesses by the polishing time.

The measurement result of the polishing speed is presented in the following Table 1-2.

TABLE 3

| Example/Comparative Example | Abrasive grains | Amount of abrasive grains added [g/L] | Organic compound (additive) | Concentration of additive [g/L] | Polishing speed of silicon nitride film [Å/min] pH 1.5 | Polishing speed of silicon nitride film [Å/min] pH 3.0 |
|---|---|---|---|---|---|---|
| Example | Sulfonic acid-immobilized colloidal silica | 30 | Phenylphosphonic acid | 0.10 | 559 | 431 |
| Example | Sulfonic acid-immobilized colloidal silica | 30 | Nitrilotrismethylene phosphonic acid | 0.13 | 601 | 448 |
| Example | Sulfonic acid-immobilized colloidal silica | 30 | (1-Aminoethyl)phosphonic acid | 0.11 | 582 | 420 |
| Comparative Example | Sulfonic acid-immobilized colloidal silica | 30 | No additive | — | 545 | 350 |
| Comparative Example | Sulfonic acid-immobilized colloidal silica | 30 | Mono-n-octyl phosphate | 0.08 | 7 | 9 |
| Comparative Example | Sulfonic acid-immobilized colloidal silica | 30 | Lauryl phosphate | 0.10 | 2 | 1 |

As clearly understood from Table 1-2, it is found that according to the polishing composition of the present invention, the polishing speed of the silicon nitride film can be significantly improved as compared to the polishing compositions of Comparative Examples.

Further, as described above, it is suggested that since the polishing compositions of Comparative Examples do not have at least one of the action site and the acceleration site, the polishing speed of the silicon nitride film cannot be improved. Instead, it is suggested that as compared to Comparative Example 1, the polishing speed of the silicon nitride film is suppressed, and thus these organic compounds have the structure of suppressing the polishing speed of the silicon nitride film. Hereinafter, description will be made in more detail.

Since mono-n-octyl phosphate has a phosphate group, it is considered that there is a acceleration site. However, it is considered that there is no action site, and thus the polishing speed is not improved.

Since lauryl phosphate has a phosphate group, these are considered to have a acceleration site. However, since there is no action site interacting with the object to be polished, it is considered that the polishing speed is not improved.

In this way, in the present invention, it is suggested that it is essential to have both the action site and the acceleration site.

Incidentally, the present application is based on Japanese Patent Application No. 2015-69958, filed on Mar. 30, 2015, Japanese Patent Application No. 2015-192753, filed on Sep. 30, 2015, and Japanese Patent Application No. 2015-192763, filed on Sep. 30, 2015, the entire contents of which are incorporated herein by reference.

The invention claimed is:

1. A polishing composition comprising:
   (1) an organic compound which has an action site interacting with an object to be polished having a silicon-oxygen bond or a silicon-nitrogen bond and an acceleration site accelerating an access of a component polishing an object to be polished to the object to be polished;
   (2) abrasive grains; and
   (3) a dispersing medium;
   wherein the polishing composition has a pH of above 7.

2. The polishing composition according to claim 1, wherein the abrasive grains are silica.

3. The polishing composition according to claim 2, wherein when the object to be polished has a silicon-nitrogen bond, the abrasive grains are sulfonic acid-immobilized silica.

4. The polishing composition according to claim 1, wherein the action site has a phosphonate group or a salt group thereof.

5. The polishing composition according to claim 1, wherein the acceleration site has a functional group having hydrophilicity.

6. The polishing composition according to claim 5, wherein the functional group having hydrophilicity is at least one selected from the group consisting of an amino group, a hydroxyl group, a phosphonate group or a salt group thereof, a carboxyl group or a salt group thereof, a phosphate group or a salt group thereof, a sulfate group or a salt group thereof, a phenyl group, and a group represented by the following Formula (1):

[Chemical Formula 1]

$$-(O-E)_n-H \qquad (1)$$

wherein in Formula (1), E is an alkylene group having 1 to 3 carbon atoms and n is an integer of 1 to 15.

7. The polishing composition according to claim 1, wherein the interaction is caused by chemical bonding selected from at least one of ion bonding, covalent bonding, and hydrogen bonding.

8. The polishing composition according to claim 2, wherein a content of the organic compound is more than a minimum concentration, which is defined by the following equation, derived from a content of the silica:

[Mathematical Formula 1]

Minimum concentration of organic compound per 1 g of silica $= \dfrac{A \times M}{B \times N}$ [g]

BET specific area of silica per 1 g: $A\,[m^2/g]$

Occupancy area of organic compound: $B\,[m^2/\text{count}]$

Molecular weight of organic compound: $M\,[g/mol]$

Avogadro's number: $N\,[\text{count}/mol]$

9. The polishing composition according to claim 1, wherein the organic compound is at least one of aryl phosphonic acid or a salt thereof and phosphonic acid, which contains at least one of a hydroxyl group and a nitrogen atom, or a salt thereof.

10. The polishing composition according to claim 1, wherein the organic compound has two or more phosphonate groups or salt groups thereof.

11. The polishing composition according to claim 1, wherein the organic compound is at least one selected from the group consisting of phenylphosphonic acid or a salt thereof, hydroxyethane-diphosphonic acid or a salt thereof, nitrilotrismethylene phosphonic acid or a salt thereof, a trihydrate of alendronic acid or a salt thereof, alendronic acid or a salt thereof, (1-aminoethyl)phosphonic acid or a salt thereof, N,N,N',N'-ethylenediamine tetrakis(methylene phosphonic acid) or a salt thereof, and glycine N,N-bis (methylene phosphonic acid) or a salt thereof.

12. The polishing composition according to claim 1, wherein the polishing composition further comprises a surfactant, wherein the surfactant is selected from the group consisting of a cationic surfactant, and amphoteric surfactant, and a nonionic surfactant.

* * * * *